United States Patent
Kim et al.

(10) Patent No.: US 9,306,190 B2
(45) Date of Patent: Apr. 5, 2016

(54) ORGANIC LIGHT EMITTING DISPLAY PANEL

(71) Applicant: LG Display Co., Ltd., Seoul (KR)

(72) Inventors: Youngho Kim, Gyeonggi-do (KR);
JuneHo Park, Gyeonggi-do (KR);
InCheol Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/571,668

(22) Filed: Dec. 16, 2014

(65) Prior Publication Data

US 2016/0049615 A1 Feb. 18, 2016

(30) Foreign Application Priority Data

Aug. 14, 2014 (KR) ........................ 10-2014-0105779

(51) Int. Cl.
*H01L 29/08* (2006.01)
*H01L 51/52* (2006.01)
*H01L 27/32* (2006.01)

(52) U.S. Cl.
CPC ........ *H01L 51/5284* (2013.01); *H01L 27/3246* (2013.01); *H01L 27/3248* (2013.01); *H01L 2251/303* (2013.01)

(58) Field of Classification Search
CPC . H01L 27/32; H01L 27/3211; H01L 51/5237; H01L 51/5281; H01L 51/5284; H01L 29/66765; H01L 2251/5315; H01L 27/3246; H01L 27/3248; H01L 2251/303; G09G 3/3233

USPC .......... 257/40, 73, 79, 88, E51.001, E51.024, 257/E51.027, E51.022
See application file for complete search history.

(56) References Cited

U.S. PATENT DOCUMENTS

| | | | |
|---|---|---|---|
| 2003/0155860 A1* | 8/2003 | Choi | H01L 51/5284 313/498 |
| 2004/0004434 A1* | 1/2004 | Nishi | H01L 27/322 313/506 |
| 2004/0252088 A1* | 12/2004 | Kawachi | H01L 27/3246 345/76 |
| 2005/0001546 A1* | 1/2005 | Yamaguchi | C23C 14/042 313/512 |
| 2005/0119387 A1* | 6/2005 | Lucas et al. | 524/407 |
| 2006/0097628 A1* | 5/2006 | Suh | H01L 27/3211 313/504 |
| 2007/0013077 A1* | 1/2007 | Lee et al. | 257/762 |
| 2007/0117257 A1* | 5/2007 | Kim et al. | 438/99 |
| 2007/0158744 A1* | 7/2007 | Song et al. | 257/347 |
| 2007/0295962 A1* | 12/2007 | Choi et al. | 257/59 |
| 2008/0283843 A1* | 11/2008 | Kawachi | 257/72 |
| 2010/0073279 A1* | 3/2010 | Kwon et al. | 345/107 |
| 2012/0001170 A1* | 1/2012 | Yamazaki | 257/43 |
| 2013/0264568 A1* | 10/2013 | Tomida et al. | 257/43 |
| 2015/0001486 A1* | 1/2015 | Kim | H01L 27/3246 257/40 |

* cited by examiner

*Primary Examiner* — Yosef Gebreyesus
(74) *Attorney, Agent, or Firm* — Morgan, Lewis & Bockius LLP

(57) ABSTRACT

A display device is provided that comprises a pattern positioned on a substrate, the pattern comprising a multi-layered structure comprising a conductive layer and at least one light-blocking layer in whole or in part; and a bank positioned on the pattern, the bank comprising a light-absorbent material.

8 Claims, 25 Drawing Sheets

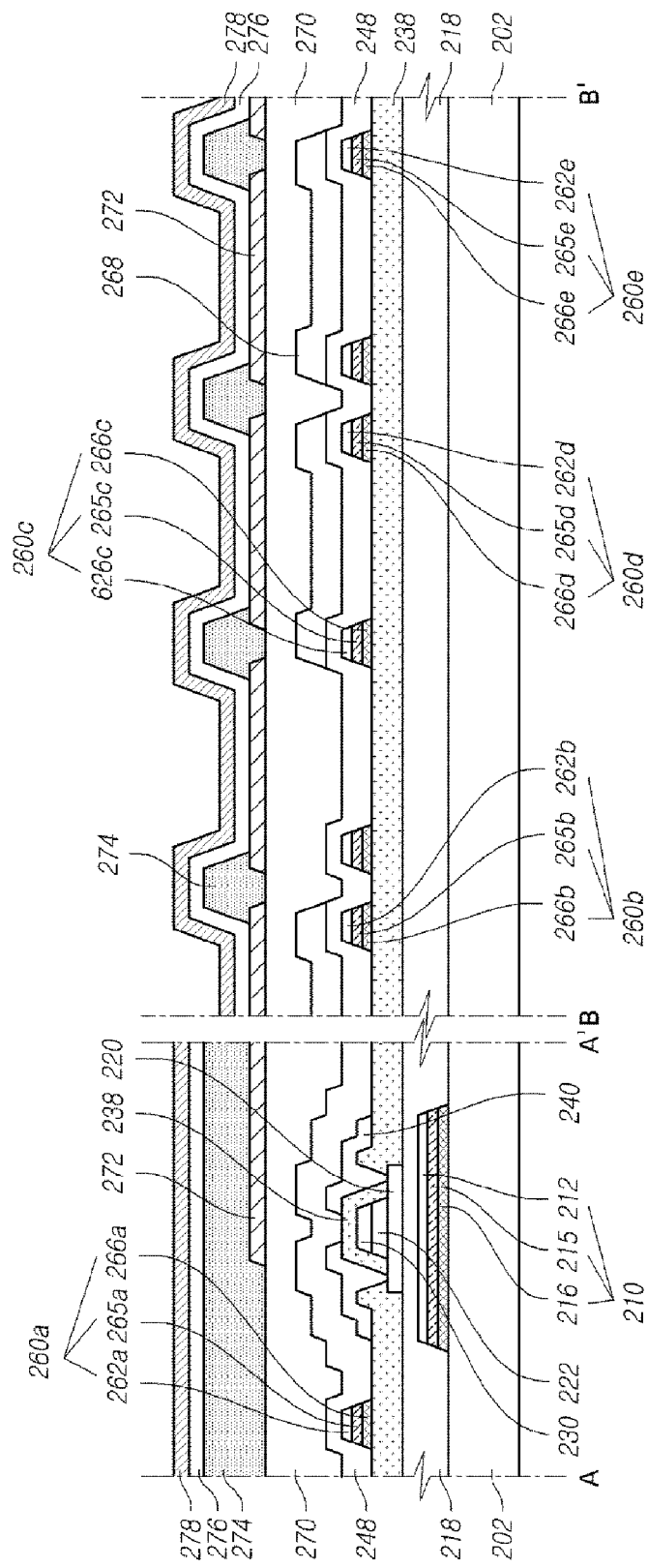

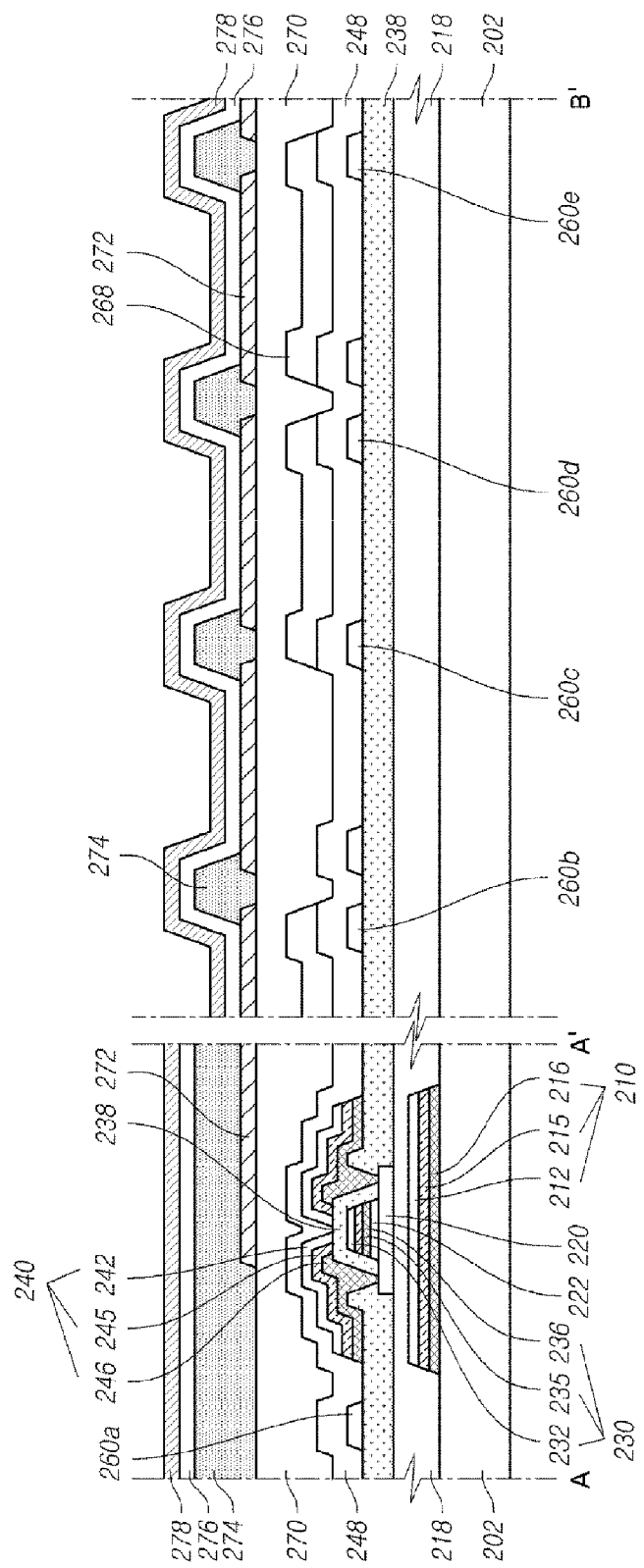

FIG. 7G

| LAYER | AREA RATIO | REFLECTIVITY | AREAL REFLECTIVITY |
|---|---|---|---|
| LAYER FOR BLOCKING LIGHT | 15.5% | 46.5% | 7.2% |
| GATE ELECTRODE | 14.3% | 41.1% | 5.9% |
| SOURCE ELECTRODE/ DRAIN ELECTRODE | 16.6% | 41.1% | 6.8% |
| R' | 3.9% | 13.5% | 0.5% |
| G' | 1.4% | 24.8% | 0.3% |
| B' | 2.9% | 6.6% | 0.2% |
| COMMON ELECTRODE | 9.9% | 74.3% | 7.3% |
| R | 7.5% | 13.5% | 1.0% |
| W | 9.8% | 74.3% | 7.3% |
| G | 6.8% | 24.8% | 1.7% |
| B | 11.3% | 6.6% | 0.7% |
| TOTAL | | | 39.05% |

FIG.8G

| LAYER | AREA RATIO | REFLECTIVITY | AREAL REFLECTIVITY |
|---|---|---|---|
| LAYER FOR BLOCKING LIGHT | 15.5% | 7.5% | 1.2% |
| GATE ELECTRODE | 14.3% | 7.5% | 1.1% |
| SOURCE ELECTRODE/ DRAIN ELECTRODE | 16.6% | 7.5% | 1.2% |
| R' | 3.9% | 6.0% | 0.2% |
| G' | 1.4% | 6.0% | 0.1% |
| B' | 2.9% | 6.0% | 0.2% |
| COMMON ELECTRODE | 9.9% | 5.0% | 0.5% |
| R | 7.5% | 13.5% | 1.0% |
| W | 9.8% | 74.3% | 7.3% |
| G | 6.8% | 24.8% | 1.7% |
| B | 11.3% | 6.6% | 0.7% |
| TOTAL | | | 15.16% |

ORGANIC LIGHT EMITTING DISPLAY PANEL

CROSS-REFERENCE TO RELATED APPLICATION

This application claims priority from and the benefit under 35 U.S.C. §119(a) of Korean Patent Application No. 10-2014-0105779, filed on Aug. 14, 2014, which is hereby incorporated by reference for all purposes as if fully set forth herein.

BACKGROUND OF THE INVENTION

1. Field of the Invention

The present invention relates to an organic light emitting display panel.

2. Description of the Prior Art

In the field of flat panel displays, liquid crystal displays have been widely used in view of the strength of lightness and low power consumption. Since the liquid crystal display is a non-emissive device that cannot emit light, however, it is unfavorable in terms of brightness, contrast ratio, viewing angle and enlargement of the device.

Accordingly, new flat panel displays are being developed to cope with the shortcomings of the liquid crystal displays. One of the new flat panel displays is an organic light emitting display that is a light-emissive device. Since the organic light emitting display is able to emit light, it exhibits enhanced brightness, a wider viewing angle and an improved contrast ratio, compared to the liquid crystal display. In addition, the organic light emitting display does not require a backlight unit, so it can be designed to be light and thin and it is preferable in its power consumption.

An organic light emitting display panel of the organic light emitting display may display images by using light emitted from an organic light emitting device that is connected to a thin film transistor in each pixel area. The organic light emitting device emits light by applying an electric field to an organic light emitting layer that is made of organic compounds between an anode and a cathode. Further, the organic light emitting device can be operated at low voltage with low power consumption. Furthermore, the organic light emitting device is light enough to be disposed on flexible substrates.

When the organic light emitting display is used outdoors or at a bright place, visibility and brightness of the organic light emitting display panel may be reduced and the contrast ratio properties thereof may be degraded due to the light incident from the outside.

SUMMARY OF THE INVENTION

In this background, an aspect of the present invention is to provide an organic light emitting display panel, which improves visibility, brightness and contrast ratio properties.

The present invention improves visibility, brightness and contrast ratio properties of the organic light emitting display panel.

One aspect of the invention is a display device comprising a pattern positioned on a substrate, the pattern comprising a multi-layered structure comprising a conductive layer and at least one light-blocking layer in whole or in part; and a bank positioned on the pattern, the bank comprising a light-absorbent material.

Another aspect of the invention is an organic light emitting display panel comprising a plurality of signal lines formed on a substrate; a transistor formed on the substrate and comprising a gate electrode, a source electrode and a drain electrode; a light-blocking layer formed between the substrate and transistor; a pixel electrode connected to the source electrode or to the drain electrode; and a bank formed along the edge of the pixel electrode such that the pixel electrode is partially exposed, the bank comprising a light-absorbent material or coated with a light-absorbent substance, wherein at least one of the signal lines, the gate electrode, the source electrode, the drain electrode and the light-blocking layer comprises a multi-layered structure comprising a conductive layer and least one light-blocking layer in whole or in part.

In an exemplary embodiment, the pattern includes a signal line, electrodes of a transistor and the light-blocking layer is configured to correspond to the transistor, which are formed on the substrate.

In an exemplary embodiment, the conductive layer comprises at least one of Al, Pt, Pd, Ag, Mg, Au, Ni, Nd, Ir, Cr, Li, Ca, Mo, Ti, W and Cu, or an alloy thereof.

In an exemplary embodiment, the light-blocking layer comprises a light-absorbent substance or a material capable of absorbing external light incident through the substrate.

In an exemplary embodiment, the light-blocking layer comprises a metal oxide, a light-absorbent metal or an alloy thereof.

In an exemplary embodiment, the metal oxide is selected from the group consisting of IGZO, IGO, IZO, ZTO, IHZO and IZZO.

In an exemplary embodiment, the external light incident through the substrate is non-polarized light.

In an exemplary embodiment, the light-blocking layer has a black-based color.

In an exemplary embodiment, the substrate is selected from the group consisting PET, PEN, polyamide and glass.

In an exemplary embodiment, the bank comprises carbon black, black pigments that are mixtures of carbon black and two or more color pigments, black dyes of a single ingredient or mixtures of two or more different color dyes, black resin, graphite powder, gravure ink, black spray or black enamel.

BRIEF DESCRIPTION OF THE DRAWINGS

The above and other objects, features and advantages of the present invention will be more apparent from the following detailed description taken in conjunction with the accompanying drawings, in which:

FIGS. 5a to 5c are schematic sectional views along the lines A-A' and B-B' of FIG. 2 according to other embodiments of the present invention.

FIGS. 7a to 7g illustrate graphs and a table showing reflectivity of the external light in the typical organic light emitting display panel.

FIGS. 8a to 8g illustrate graphs and a table showing reflectivity of the external light in an organic light emitting display panel according to another embodiment of the present invention.

DETAILED DESCRIPTION OF THE INVENTION

Figure 1:
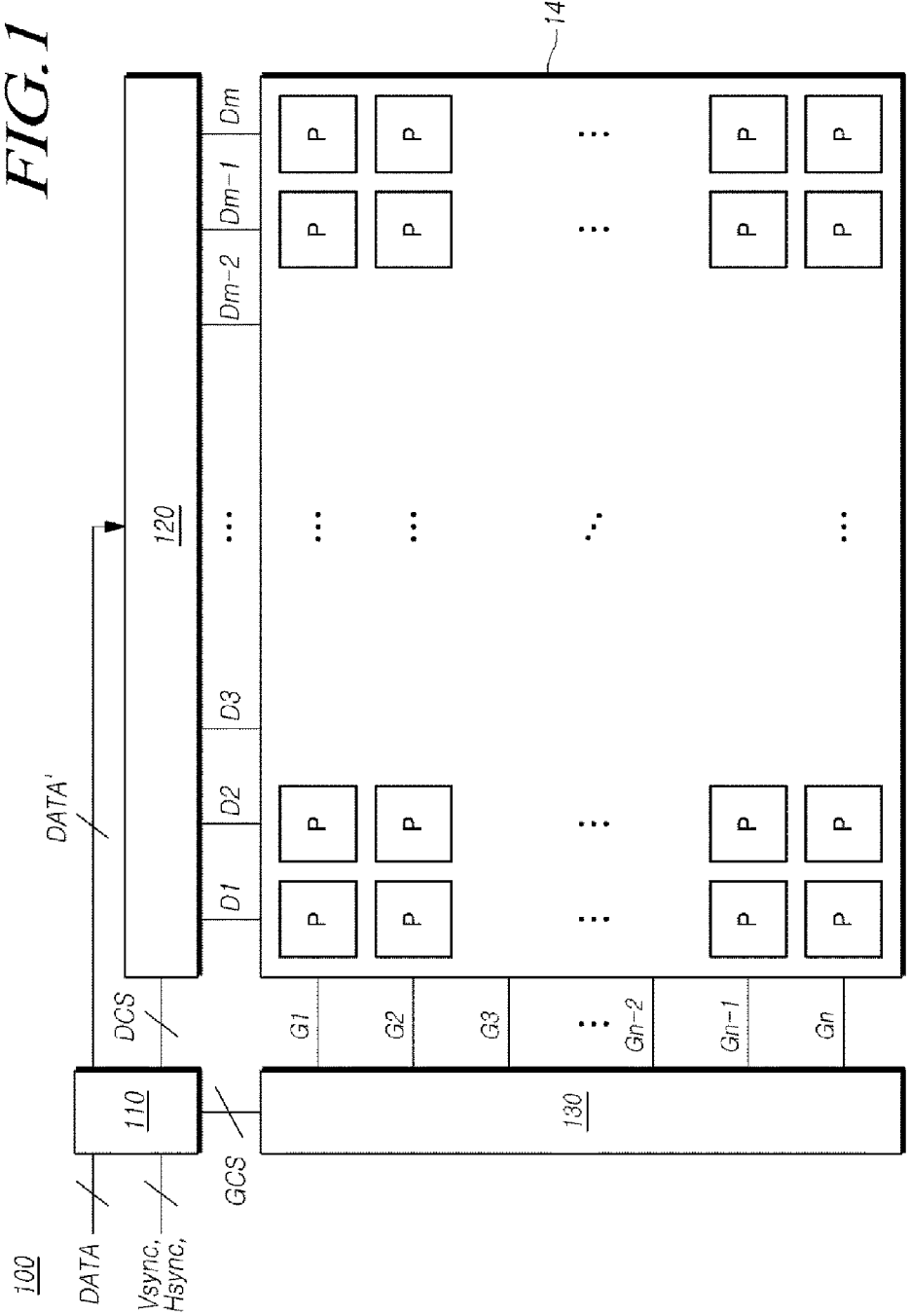
FIG. 1 illustrates a system configuration of an organic light emitting display to which embodiments of the present invention are applied.

Hereinafter, embodiments of the present invention will be described with reference to the accompanying drawings. In the following description, the same elements will be designated by the same reference numerals although they are shown in different drawings. Further, in the following description of embodiments of the present invention, a detailed description of known functions and configurations incorporated herein will be omitted when it may make the subject matter of the present invention unclear.

In addition, terms, such as first, second, A, B, (a), (b) or the like may be used herein when describing components of the present invention. These terms are merely used to distinguish one structural element from other structural elements, and a property, an order, a sequence and the like of a corresponding structural element are not limited by the term. It should be noted that if it is described in the specification that one component is "connected," "coupled" or "joined" to another component, a third component may be "connected," "coupled," and "joined" between the first and second components, although the first component may be directly connected, coupled or joined to the second component. Likewise, when it is described that a certain element is formed "on" or "under" another element, it should be understood that the certain element may be formed either directly or indirectly via a still another element on or under another element.

FIG. 1 illustrates a system configuration of an organic light emitting display to which embodiments of the present invention are applied.

Referring to FIG. 1, the organic light emitting display 100 includes an organic light emitting display panel 140, a data driving unit 120, a gate driving unit 130 and a timing controller 110.

First, the timing controller 110 outputs a data control signal DCS for controlling the data driving unit 120 and a gate control signal GCS for controlling the gate driving unit 130 on the basis of external timing signals, such as vertical/horizontal synchronization signals Vsync and Hsync input from a host system, image data and a clock signal CLK. In addition, the timing controller 110 may transform the image data "Data" input from the host system into data signals used in the data driving unit 120 and supply the transformed image data "Data'" to the data driving unit 120.

The data driving unit 120, in response to the data control signal DCS and the transformed image data "Data'" input from the timing controller 110, transforms the image data "Data'" into data signals of voltage (analog pixel signals or data voltage) corresponding to gray scale values and supply the same to data lines D1 to Dm.

The gate driving unit 130 supplies scan signals (gate pulses or scan pulses, gate-on signals) to gate lines G1 to Gn in sequence, in response to the gate control signals GCS input from the timing controller 110.

Meanwhile, each pixel P of the organic light emitting display panel 140 is formed in the pixel area that is defined by the data lines D1 to Dm and the gate lines G1 to Gn to have an arrangement of a matrix, and it may be at least one organic light emitting device that includes the first electrode of an anode, i.e., a pixel electrode, the second electrode of a cathode, i.e., a common electrode and an organic layer.

The gate lines G1 to Gn, the data lines D1 to Dm and high potential voltage lines for supplying a high potential voltage are formed in each pixel P. Further, in each pixel P, a switching transistor is formed between the gate lines G1 to Gn and the data lines D1 to Dm, and an organic light emitting diode comprised of a positive electrode, a negative electrode and an organic light emitting layer is formed. Furthermore, a driving transistor is formed between a source electrode (or drain electrode) of the switching transistor and the high potential voltage lines in each pixel.

Here, at least one of the gate lines G1 to Gn, the data lines D1 to Dm, the gate electrode and the source electrode (or drain electrode) of each transistor may have a multi-layered structure comprised of a conductive layer and at least one light-blocking layer.

In addition, a layer for blocking out the external light may be formed below a semiconductor layer of each transistor, and the layer for blocking light may be comprised of a conductive layer and at least one light-blocking layer.

This will be described in more detail with reference to the drawings hereinafter.

Figure 2:
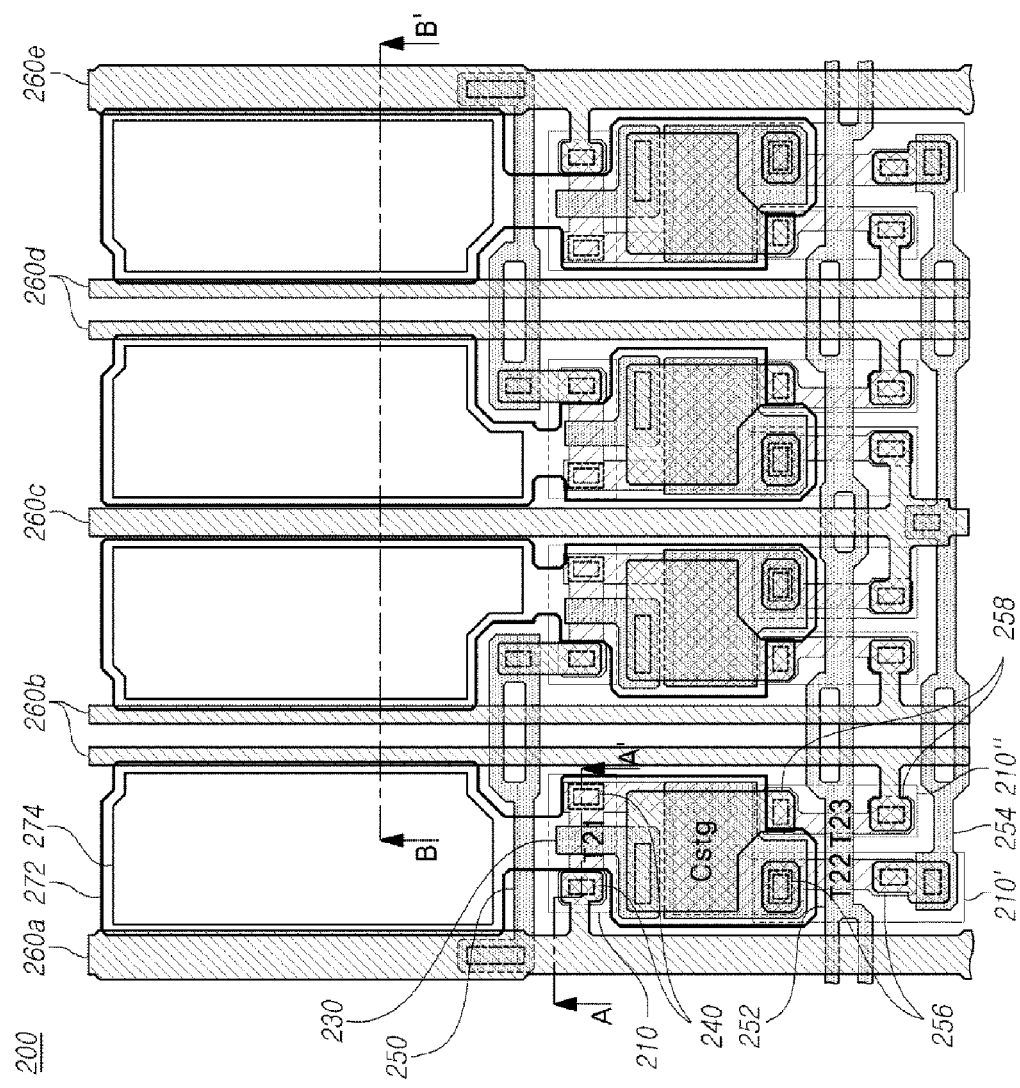
FIG. 2 is a schematic plan view of an organic light emitting display panel according to an embodiment of the present invention.

FIG. 2 is a schematic plan view of an organic light emitting display panel according to an embodiment of the present invention. FIG. 2 shows four sub-pixels which are illustrated in a 3T-1C structure that includes three transistors T21, T22 and T23 and one storage capacitor Cstg, but it is an example only for the convenience of explanation and the present invention is not limited thereto. Each of the sub-pixels may emit one of a red light, a green light, a blue light and a white light.

Referring to FIG. 2, the organic light emitting display panel 200 may include a plurality of signal lines 250, 252, 254, 260a, 260b, 260c, 260d and 260e formed on a substrate 202, transistors T21, T22 and T23 which are formed on the substrate 202 and comprised of gate electrodes 230 and 252, a source electrode and drain electrodes 240, 256 and 258, layers 210, 210' and 210" for blocking light, which are formed between the substrate 202 and the transistors T21, T22 and T23, a pixel electrode 272 connected with the source electrode or the drain electrodes 240, 256 and 258, and a bank 274 formed along the edge of the pixel electrode 272 such that a portion of the pixel electrode 272 is exposed, which is made of a light-absorbent material or coated with a light-absorbent substance. Further, at least one of the signal lines 250, 252, 254, 260a, 260b, 260c, 260d and 260e, the gate electrodes 230 and 252, the source electrode, the drain electrodes 240, 256 and 258, and the layers 210, 210' and 210" for blocking light may have a multi-layered structure that is comprised of a conductive layer (not shown) and at least one light-blocking layer (not shown) in whole or in part.

The organic light emitting display panel 200 may include a multitude of signal lines on the substrate 202, and the first line 260a, the second line 260b, the third line 260c, the fourth line 260d and the fifth line 260e are arranged in parallel to be spaced from each other in the first direction (the vertical direction in FIG. 2).

The first line 260a and the fifth line 260e may be high potential voltage lines (VDD lines), and the second line 260b and the fourth line 260d may be data lines. Further, the third line 260c may be a reference voltage line, but the invention is not limited thereto.

The sixth line 250, the seventh line 252 and the eighth line 254 are arranged in parallel to be spaced from each other in the second direction (the horizontal direction in FIG. 2). Here, the sixth line 250 may be connected with the first line 260a by a contact hole to thereby supply a high voltage power to adjacent sub-pixels. The seventh line 252 may be a gate line (or a scan line), and the eighth line 254 may be connected with the third line 260c of the reference voltage line by a contact hole to thereby supply a reference voltage to adjacent sub-pixels.

Meanwhile, each sub-pixel may include the transistors T21, T22 and T23.

The first transistor T21 may be a driving transistor for driving the pixel electrode 272 and may include the first gate electrode 230 and the first source electrode/the first drain electrode 240.

The second transistor T22 may be a sensing transistor and may include the second gate electrode 252 and the second source electrode/the second drain electrode 256. One end of the second transistor T22 is connected with the storage capacitor Cstg, and the other end thereof is connected with the eighth line 254.

The third transistor T23 may be a switching transistor and may include the third gate electrode 252 and the third source electrode/the third drain electrode 258. One end of the third transistor T23 is connected with the second line 260b, and the other end thereof is connected with first gate electrode 230 of the first transistor T21 through a contact hole.

In the electric operation of the organic light emitting display panel 200, first, the third transistor T23 is turned on by a scan signal supplied from the sixth line 252 and transfers a data signal supplied through the second line 250b to the first gate electrode 230 of the first transistor T21. In addition, the storage capacitor Cstg stores the data signal supplied through the third transistor T23 to maintain the second transistor T22 to be turned on for more than a predetermined time (one frame). In addition, the first transistor T21 is operated in response to the data signal stored in the storage capacitor Cstg. That is, the first transistor T21 controls a driving current or a driving voltage supplied to the pixel electrode 272 in response to the data signal.

When the first transistor T21 is operated, a light-emitting layer (not shown) of the organic layer (not shown) emits light by the current supplied through the first line 260a. The driving current supplied through the driving transistor T21 is transferred to the pixel electrode 272 and flows through the organic layer (not shown) to thereby emit light by recombination of electrons and holes, and then the current finally flows to a common electrode (not shown).

Meanwhile, the organic light emitting display panel 200 may include the pixel electrode 272, a common electrode (not shown) that is spaced to face the pixel electrode, and a bank 274 formed along the edge of the pixel electrode 272. The bank 274 may be a black bank that is made of black color-based material. Further, the bank 274 may be made of a light-absorbent material or coated with a light-absorbent substance to absorb an incident light from the outside.

According to embodiments of the present invention, the transistors T21, T22 and T23 of the organic light emitting display panel 200 may be oxide transistors of which a semiconductor layer is made of metal oxides. In addition, the layers 210, 210' and 210" for blocking light may be formed in the areas corresponding to the semiconductor layers of the transistors T21, T22 and T23, because the external light incident on the semiconductor layers may affect the electrical properties or chemical properties of the oxide transistors. This will be described in detail with reference to the corresponding drawings later.

Meanwhile, at least one of the above-mentioned signal lines 250, 252, 254, 260a, 260b, 260c, 260d and 260e, the gate electrodes 230 and 252, the source electrode, the drain electrodes 240, 256 and 258, and the layers 210, 210' and 210" for blocking light may have a multi-layered structure that is comprised of a conductive layer (not shown) and at least one light-blocking layer (not shown) in whole or in part.

Here, the light-blocking layer (not shown) may be made of a material that absorbs the external light incident through the substrate 202 or may be coated with a light-absorbent substance. The embodiments of the present invention do not require a polarizing plate or a polarizing layer, and thus the external light refers to a non-polarized light.

In addition, the light-blocking layer (not shown) may be made of metal oxides, a light-absorbent metal or an alloy thereof, and may have black-based colors. This will be described in detail below.

Figure 3:
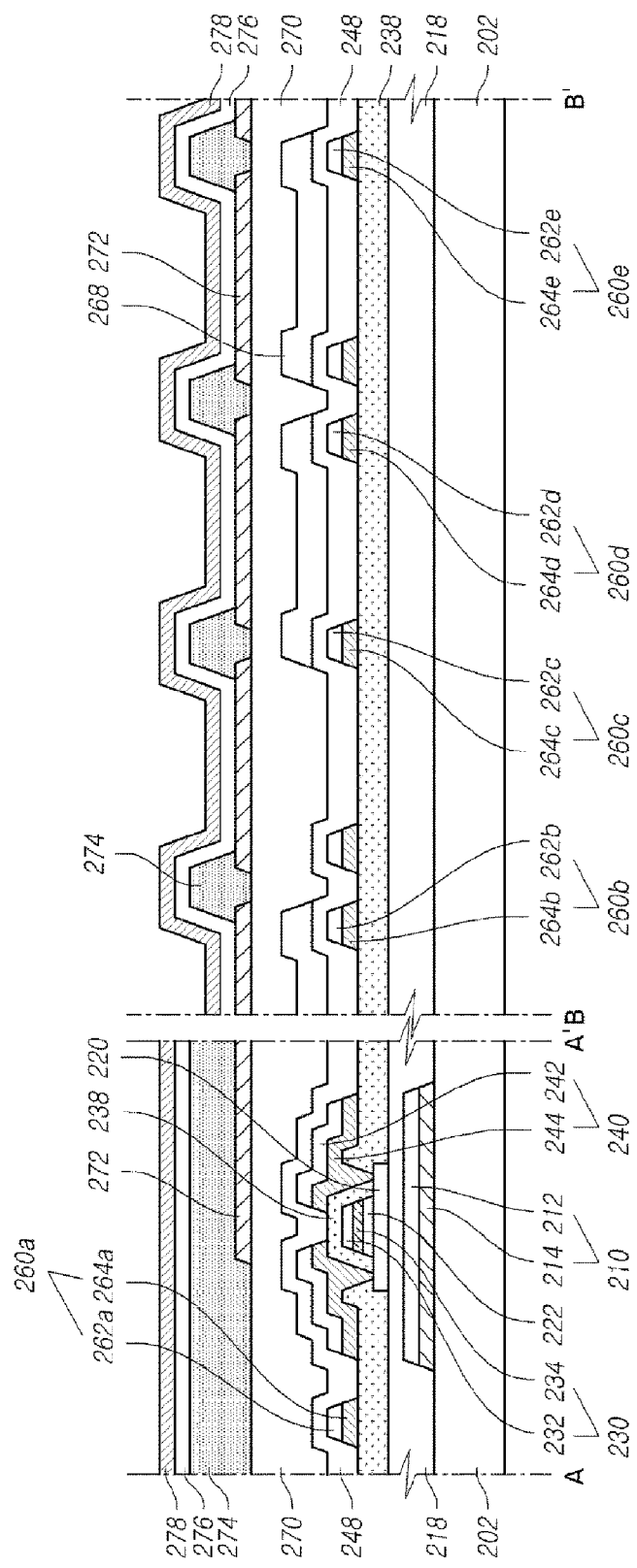
FIG. 3 is a schematic sectional view of an organic light emitting display panel along the lines A-A' and B-B' in FIG. 2 according to an embodiment of the present invention.

FIG. 3 is a schematic sectional view of an organic light emitting display panel along the lines A-A' and B-B' in FIG. 2.

A-A' of FIG. 3 shows a sectional view of the first line 260a and the first transistor T21 of the organic light emitting display panel 200, and B-B' of FIG. 3 shows a sectional view of the sub-pixels of FIG. 2 in the first direction.

Here, each of the sub-pixels may emit a red light, a blue light, a green light and a white light, respectively, and the organic light emitting display panel 200 is designed to be bilaterally symmetric. In addition, the sub-pixels may be divided into the area where light is emitted and the area where the transistors T21, T22 and T23, and the storage capacitor Cstg are formed, but this is only for the convenience of explanation, and the organic light emitting display panel 200 according to the embodiments may be variously designed. For example, the organic light emitting display panel 200 may be a 2T-1C structure and may have two or more gate lines or more transistors.

In addition, although the organic light emitting display panel 200 of FIG. 3 is illustrated in a bottom emission type in which emitted light is directed from the pixel electrode 272 toward the substrate 202, the present invention is not limited thereto and may be implemented by a top emission type.

As shown in A-A' of FIG. 3, the organic light emitting display panel 200 may include the first insulating layer 218 formed on the substrate 202, the first transistor T21 and the first line 260a formed on the first insulating layer 218, the pixel electrode 272 on the first transistor T21, the bank 274 formed to cover the pixel electrode 272, and the organic layer 276 and the common electrode 278 formed on the bank 274 in sequence.

Here, the first transistor T21 of the organic light emitting display panel 200 may be, for example, an oxide transistor. In addition, the first transistor T21 may include the first semiconductor layer 220, the second insulating layer 222 formed on the first semiconductor layer 220, the first gate electrode 230 formed on the second insulating layer 222, the third insulating layer 238 formed on the first gate electrode 230, and the first source electrode/the first drain electrode 240 formed on the third insulating layer 238 to be connected with the first semiconductor layer 220 by a contact hole. Here, the second insulating layer 222 may be a gate insulating layer that insulates the first gate electrode 230 from the first semiconductor layer 220.

Meanwhile, the organic light emitting display panel 200 may include the fourth insulating layer 248 that is formed on the first line 260a and the first source electrode/the first drain electrode 240, and a flattening layer 270 that is formed on the fourth insulating layer 248.

The substrate 202 may adopt plastic substrates including polyethylene terephthalate (PET), polyethylenenaphthalate (PEN) and polyimide as well as a glass substrate. In addition, a buffering layer for preventing penetration of impurities may be further provided on the substrate 202. The buffering layer may be formed of, for example, a single layer or a multi-layer of silicon nitrides or silicon oxides.

The first semiconductor layer 220 of the first transistor T21 may be made of metal oxides that may be one of, for example, indium gallium zinc oxide (IGZO), indium gallium oxide (IGO), indium zinc oxide (IZO), zinc tin oxide (ZTO), indium hafnium zinc oxide (IHZO) and indium zirconium zinc oxide (IZZO).

Since the first semiconductor layer 220 may be changed in its electrical properties or its chemical properties by the incident light from the outside, the first layer 210 for blocking light may be formed below the first semiconductor layer 220. The first layer 210 for blocking light may be positioned between the substrate 202 and the semiconductor layer 220 of the first transistor T21 to correspond to the semiconductor layer 220 of the first transistor T21. The first layer 210 for blocking light may protect the first semiconductor layer 220 from the external light to thereby prevent degradation of visibility, brightness and contrast ratio properties due to reflection of the external light.

Meanwhile, at least one of the first line 260a, the layer 210 for blocking light, the first gate electrode 230, the first source electrode and the first drain electrode 240 of the first transistor T21 may have a multi-layered structure. Specifically, the multi-layered structure may be comprised of conductive layers 262a, 212, 232 and 242, and one or more light-blocking layers 264a, 214, 234 and 244.

Although the light-blocking layers 264a, 214, 234 and 244 are illustrated in a single layer in FIG. 3, the embodiments of the present invention are not limited thereto, and the light-blocking layers 264a, 214, 234 and 244 may have a multi-layered structure. The light-blocking layers 264a, 214, 234 and 244 of a multi-layered structure will be additionally described with reference to the corresponding drawing later.

The conductive layers 262a, 212, 232 and 242 may be made of, for example, one of Al, Pt, Pd, Ag, Mg, Au, Ni, Nd, Ir, Cr, Li, Ca, Mo, Ti, W and Cu, or an alloy thereof.

The light-blocking layers 264a, 214, 234 and 244 may be made of a material that absorbs the external light or coated with a light-absorbent substance.

Specifically, the light-blocking layers 264a, 214, 234 and 244 may be metal oxides, such as indium tin oxide (ITO) and indium zinc oxide (IZO). The external light may encompass the light reflected by the boundary surfaces of the light-blocking layers 264a, 214, 234 and 244, and the light that penetrates through the light-blocking layers 264a, 214, 234 and 244 and is reflected by the boundary surfaces of the conductive layers 262a, 212, 232 and 242. Here, destructive interference occurs between the lights reflected by different boundary surfaces, so that the incident light is not redirected toward the outside of the organic light emitting display panel 200. Therefore, degradation of visibility due to the external light may be prevented.

Further, the light-blocking layers 264a, 214, 234 and 244 may be made of a black color-based material that absorbs light. For example, the light-blocking layers 264a, 214, 234 and 244 may be one of Mo, Cr, Ti, Nb, Mn and Ta, or an alloy thereof. However, the embodiments of the present invention are not limited thereto, and may adopt other metals that can absorb light. Accordingly, the external light is prevented from being reflected back toward the outside.

The conductive layer 262a of the first line 260a, the conductive layer 212 of the first layer 210 for blocking light, the conductive layer 232 of the first gate electrode 230, and the conductive layer 242 of the first source electrode/the first drain electrode 240 may be made of the same material or different materials. In addition, the light-blocking layer 264a of the first line 260a, the light-blocking layer 214 of the first layer 210 for blocking light, the light-blocking layer 234 of the first gate electrode 230, and the light-blocking layer 244 of the first source electrode/the first drain electrode 240 may be made of the same material or different materials.

Although not shown in FIG. 3, it should be noted that the second gate electrode 252 and the second source electrode/the second drain electrode 256 of the second transistor T22, and the third gate electrode 252 and the third source electrode/the third drain electrode 258 of the third transistor T23 in FIG. 2 may be formed with the conductive layer and one or more light-blocking layers.

Meanwhile, the first insulating layer 218, the second insulating layer 222, the third insulating layer 238 and the fourth insulating layer 248 may be an inorganic insulating material including one of SiOx, SiNx, SiON, Al2O3, TiO2, Ta2O5, HfO2, ZrO2, BST and PZT, an organic insulating material including benzenecyclobutene (BCB) or acryl-based resin, or a combination thereof.

Meanwhile, as shown in B-B' of FIG. 3, the organic light emitting display panel 200 may include the first insulating layer 218 formed on the substrate 202, the third insulating layer 238 formed on the first insulating layer 218, a multitude of signal lines 260b, 260c, 260d and 260e formed on the third insulating layer 238, the fourth insulating layer 248 formed on the signal lines, a color filter 268 formed on the fourth insulating layer 248, a flattening layer 270 formed on the color filter 268, a pixel electrode 272 formed on the flattening layer 270, a bank 274 formed along the edge of the pixel electrode 272 to make the pixel electrode 272 exposed in part, and an organic layer 276 and a common electrode 278 formed on the pixel electrode 272 and the bank 274 in sequence.

Here, at least one of the second line 260b, the third line 260c, and the fourth line 260d and the fifth line 260e may be comprised of conductive layers 262b, 262c, 262d and 262e and one or more light-blocking layers 264b, 264c, 264d and 264e.

The conductive layers 262b, 262c, 262d and 262e may be made of, for example, one of Al, Pt, Pd, Ag, Mg, Au, Ni, Nd, Ir, Cr, Li, Ca, Mo, Ti, W and Cu, or an alloy thereof, but they are not limited thereto.

The light-blocking layers 264b, 264c, 264d and 264e may be made of a material that absorbs the external light incident through the substrate 202 or coated with a light-absorbent substance. In addition, the light-blocking layers 264b, 264c, 264d and 264e may be metal oxides, such as ITO and IZO, or may be made of a light-absorbent metal or an alloy thereof, and may have black-based colors.

The conductive layers 262b, 262c, 262d and 262e and the light-blocking layers 264b, 264c, 264d and 264e may be made of the same material or different materials.

In addition, although the light-blocking layers 264b, 264c, 264d and 264e are illustrated in a single layer in FIG. 3, the embodiments of the present invention are not limited thereto, and the light-blocking layers 264b, 264c, 264d and 264e may have a multi-layered structure.

The pixel electrode 272 may be an anode (positive electrode) and it may be made of a transparent conductive material that has a high work function value, i.e., metal oxides, such as indium tin oxide (ITO) or indium zinc oxide (IZO), a mixture of metal and oxides, such as ZnO:Al or SnO2:Sb, and conductive polymer, such as poly(3-methylthiophene), poly [3,4-(ethylene-1,2-dioxin)thiophene](PEDT), polypyrrole and polyaniline. Further, the pixel electrode 272 may be a carbon nano tube (CNT), graphene, a silver nano wire, or the like.

Meanwhile, the bank 274 has a lattice structure in the form of a matrix over the substrate 202 and surrounds the edge of the pixel electrode 272 to make a portion of the pixel electrode 272 exposed.

The bank 274 may be made of a black-based material and may include one of carbon black, black pigments that are mixtures of carbon black and two or more color pigments, black dyes of a single ingredient or mixtures of two or more different color dyes, black resin, graphite powder, gravure ink, black spray, or black enamel.

The bank 274 may absorb the incident light from the outside to prevent degradation of visibility and contrast ratio and to improve brightness.

Meanwhile, the organic layer 276 may include a hole injection layer, a hole transport layer, a light-emitting layer, a light-emitting auxiliary layer, an electron transport layer, an electron injection layer, and the like. The organic layer 276 of FIG. 3 is coated on the whole surface without patterning. Thus, the manufacturing procedure may be simple by eliminating the patterning process.

The common electrode 278 is formed on the organic layer 276. The common electrode 278 may be a cathode electrode (negative electrode) and may be made of a material that has a relatively low work function value. For example, in the case of the bottom-emission type, the common electrode 278 may be metal, i.e., a single layer of an alloy of the first metal, such as Ag, and the second metal, such as Mg at a predetermined ratio, or a multi-layer thereof.

The organic light emitting diode (OLED) of the organic light emitting display panel 200 in FIG. 3 may be a white OLED that emits a white light. Here, the OLED includes the pixel electrode 272, the organic layer 276 and the common electrode 278. The organic layer of the OLED may be coated on the whole surface in a single process, and in this case, the color filter 268 may be included.

The color filter 268 of each sub-pixel may have one color of red, blue and green. In addition, in the case of a white sub-pixel, the color filter 268 may not be provided. The arrangement of red, blue and green colors may be variously designed, and a black matrix (not shown) made of a material that can absorb the external light may be interposed between the color filters 268.

In the case of the organic light emitting display panel 200 in a bottom-emission type, the color filter 268 may be positioned below the pixel electrode 272. The light generated in the organic layer is reflected by the common electrode 278 of the cathode electrode and is directed toward the outside of the organic light emitting display panel 200 via the color filter 268.

FIGS. 4a to 4d illustrate examples of the layer 210 for blocking light in an organic light emitting display panel 200 according to another embodiment of the present invention.

Although the examples of the layer 210 for blocking light are illustrated in FIGS. 4a to 4d in order to describe the operation of blocking out the external light, the examples of FIGS. 4a to 4d can be applied to the signal lines 250, 252, 254, 260a, 260b, 260c, 260d and 260e, the gate electrodes 230 and 252, the source electrode, the drain electrodes 240, 256 and 258, and the layers 210, 210' and 210" for blocking light.

The organic light emitting display panel 200 according to embodiments of the present invention does not include a polarizing plate or a polarizing layer, and thus the external light refers to a non-polarized light.

Figure 4A:
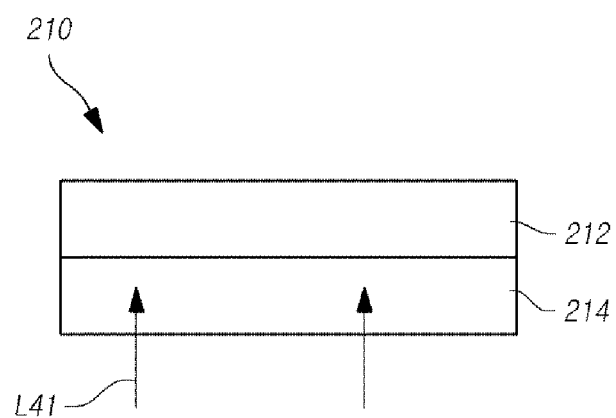
FIGS. 4a to 4d illustrate examples of layers for blocking light in an organic light emitting display panel according to other embodiments of the present invention.
Figure 4B:
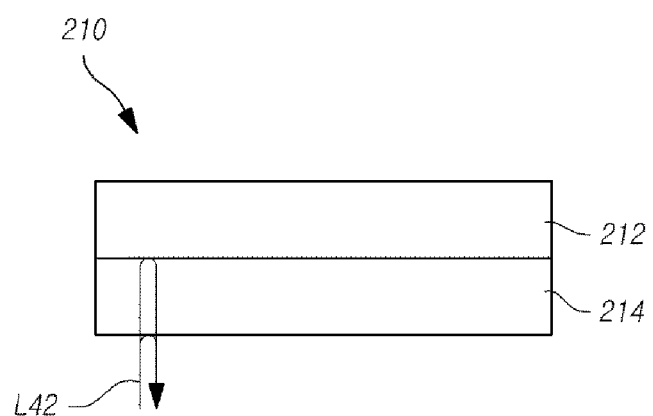

FIGS. 4a and 4b show a layer 210 for blocking light made of a conductive layer 212 and a single light-blocking layer 214.

Referring to FIG. 4a, the light-blocking layer 214 is made of or coated with a black-based material that can absorb light, so the layer 210 for blocking light may absorb the first light L41 incident from the outside.

Referring to FIG. 4b, the light-blocking layer 214 is made of metal oxides or an alloy of a light-absorbent metal and metal oxides, so the layer 210 for blocking light may block out the second light L42 incident from the outside. Specifically, the second light L42 reflected by the surface of the light-blocking layer 214 may destructively interfere with the second light L42 that penetrates through the light-blocking layer 214 and is reflected by the boundary surface of the conductive layer 212 and the light-blocking layer 214 to thereby prevent the second light L42 from being redirected back toward the outside.

Figure 4C:
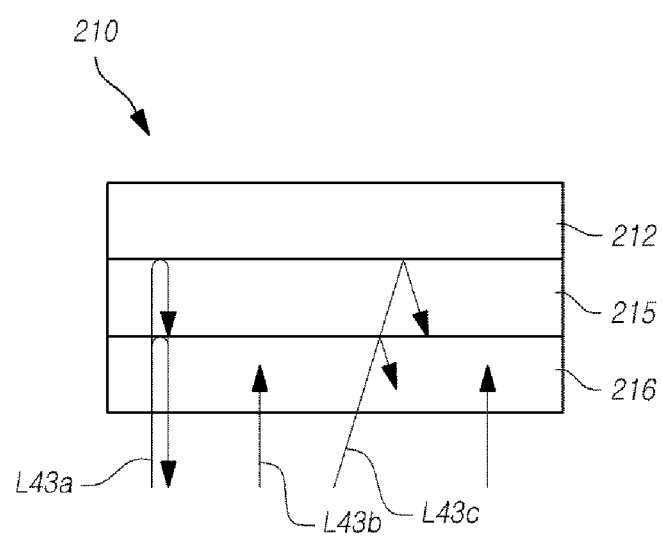

FIG. 4c shows a layer 210 for blocking light made of a conductive layer 212 and two light-blocking layers 215 and 216.

Referring to FIG. 4c, the light-blocking layers 215 and 216 may be comprised of the first light-blocking layer 215 and the second light-blocking layer 216. The first light-blocking layer 215 may include metal oxides, and the second light-blocking layer 216 may include a light-absorbent material or may be coated with a light-absorbent substance. Specifically, the first light-blocking layer 215 may be at least one of ITO, IZO and ITZO, and the second light-blocking layer 216 may include at least one of Mo, Cr, Ti, Ta, Mn and Nb.

As shown in the drawing, the external light L43a and the external light L43c may disappear by the destructive interference, and the light L43b may be eliminated by being absorbed by the absorbent metal of the second light-blocking layer 216.

The organic light emitting display panel 200 including the light-blocking layers 215 and 216 of a double-layered structure may have the effect of remarkably reducing the reflectivity of the incident light from the outside in various methods.

Figure 4D:
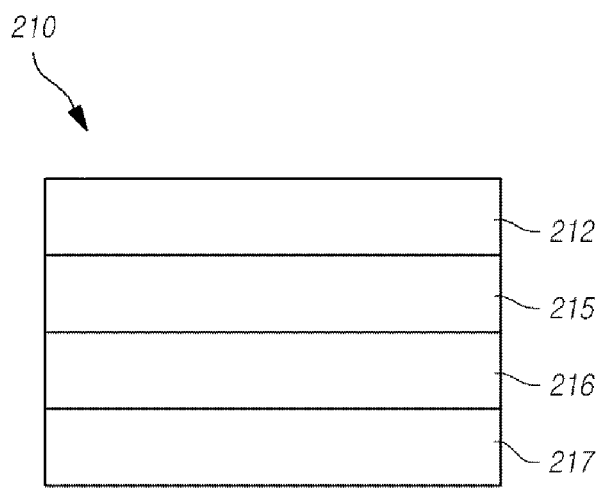

Referring to FIG. 4d, the layer 210 for blocking light of the organic light emitting display panel 200 may include light-blocking layers 215, 216 and 217 of a triple-layered structure. That is, the layer 210 for blocking light may include the first light-blocking layer 215, the second light-blocking layer 216 and the third light-blocking layer 217. The first light-blocking layer 215, the second light-blocking layer 216 and the third light-blocking layer 217 may include metal oxides or a light-absorbent material, or may be coated with a light-absorbent substance.

Furthermore, it should be noted that the organic light emitting display panels 200 according to the embodiments are not limited to the above structures, and may include light-blocking layers having various forms and sequences.

The above-mentioned light-blocking layers 214, 215 and 216 have the effect of preventing degradation of visibility and contrast ratio due to the reflection of the incident lights L41, L42, L43a, L43b and L43c from the outside by destructive interference or absorption and improving brightness.

Figure 5B:
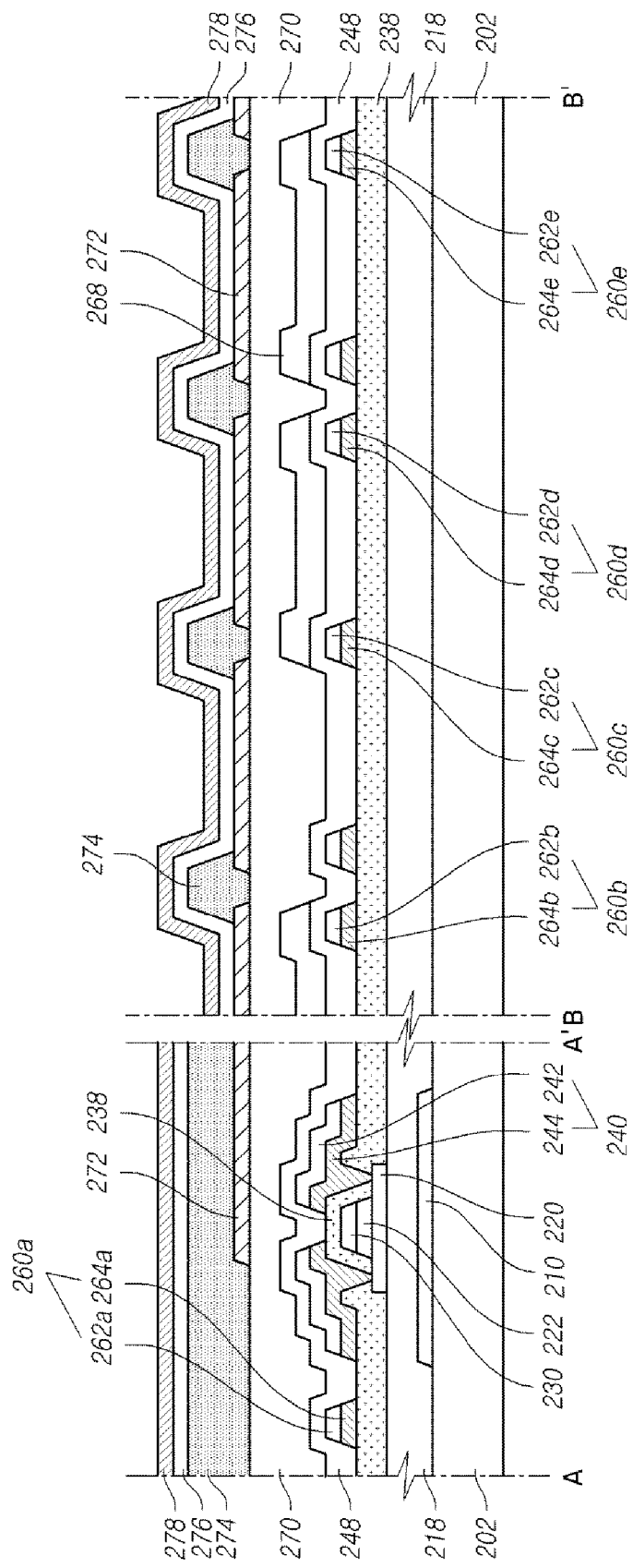

FIGS. 5a to 5c are sectional views along the lines A-A' and B-B' of FIG. 2 according to other embodiments of the present invention.

As described in FIGS. 2 and 3, at least one of the signal lines 250, 252, 254, 260a, 260b, 260c, 260d and 260e, the gate electrodes 230 and 252, the source electrode, the drain electrodes 240, 256 and 258, and the layers 210, 210' and 210" for blocking light may have a structure by which the external light is blocked out. FIGS. 5a to 5c illustrate some examples of such structures, but the embodiments of the present invention are not limited thereto and may be variously designed.

Referring to FIGS. 5a to 5c, the organic light emitting display panel 200 may include a multitude of signal lines 260a, 260b, 260c, 260d and 260e, a layer 210 for blocking light, the first gate electrode 230, the first source electrode/the first drain electrode 240, a pixel electrode 272, a bank 274 and a common electrode 278.

The multiple signal lines 260a, 260b, 260c, 260d and 260e, and the layer 210 for blocking light may include conductive layers 262a, 262b, 262c, 262d, 262e and 212, the first blocking layers 265a, 265b, 265c, 265d, 265e and 215, and the second blocking layers 266a, 266b, 266c, 266d, 266e and 216.

Here, the first blocking layers 265a, 265b, 265c, 265d, 265e and 215 may be made of metal oxides, such as ITO, IZO and ITZO, and the second blocking layers 266a, 266b, 266c, 266d, 266e and 216 may include at least one of Mo, Cr, Ti, Ta, Mn and Nb.

In the case of the organic light emitting display panel 200 of FIG. 5b, the layer 210 for blocking light and the first gate electrode 230 may not include the light-blocking layers, and the multiple signal lines 260a, 260b, 260c, 260d and 260e, and the first source electrode/the first drain electrode 240 may include light-blocking layers 264a, 264b, 264c, 264d, 264e and 244 of a single layer.

Meanwhile, in the case of the organic light emitting display panel 200 of FIG. 5c, the multiple signal lines 260a, 260b, 260c, 260d and 260e may not include the light-blocking layers, and the first gate electrode 230, the first source electrode/the first drain electrode 240, and the layer 210 for blocking light may include the first blocking layers 215, 235 and 245 made of metal oxides and the second blocking layers 216, 236 and 246 made of black-based light-absorbent material.

The bank 274 of the organic light emitting display panel 200 shown in FIGS. 5a to 5c may be a black bank made of a black-based material, and may include, for example, one of carbon black, black pigments that are mixtures of carbon black and two or more color pigments, black dyes of a single ingredient or mixtures of two or more different color dyes, black resin, graphite powder, gravure ink, black spray, or black enamel.

In the case of the external light incident on the organic light emitting display panel 200 from the outside, the external light may be absorbed by the light-blocking layers 264a, 264b, 264c, 264d, 264e and 244, the first blocking layers 265a, 265b, 265c, 265d, 265e, 215, 235 and 245, and the second blocking layers 266a, 266b, 266c, 266d, 266e, 216, 236 and 246, and the bank 274, or may disappear due to the destructive interference, to thereby improve visibility, contrast ratio and brightness.

Until now, the configuration of the organic light emitting display panels 200 according to embodiments of the present invention has been described, and hereinafter, the effect thereof will be described in detail.

Figure 6:
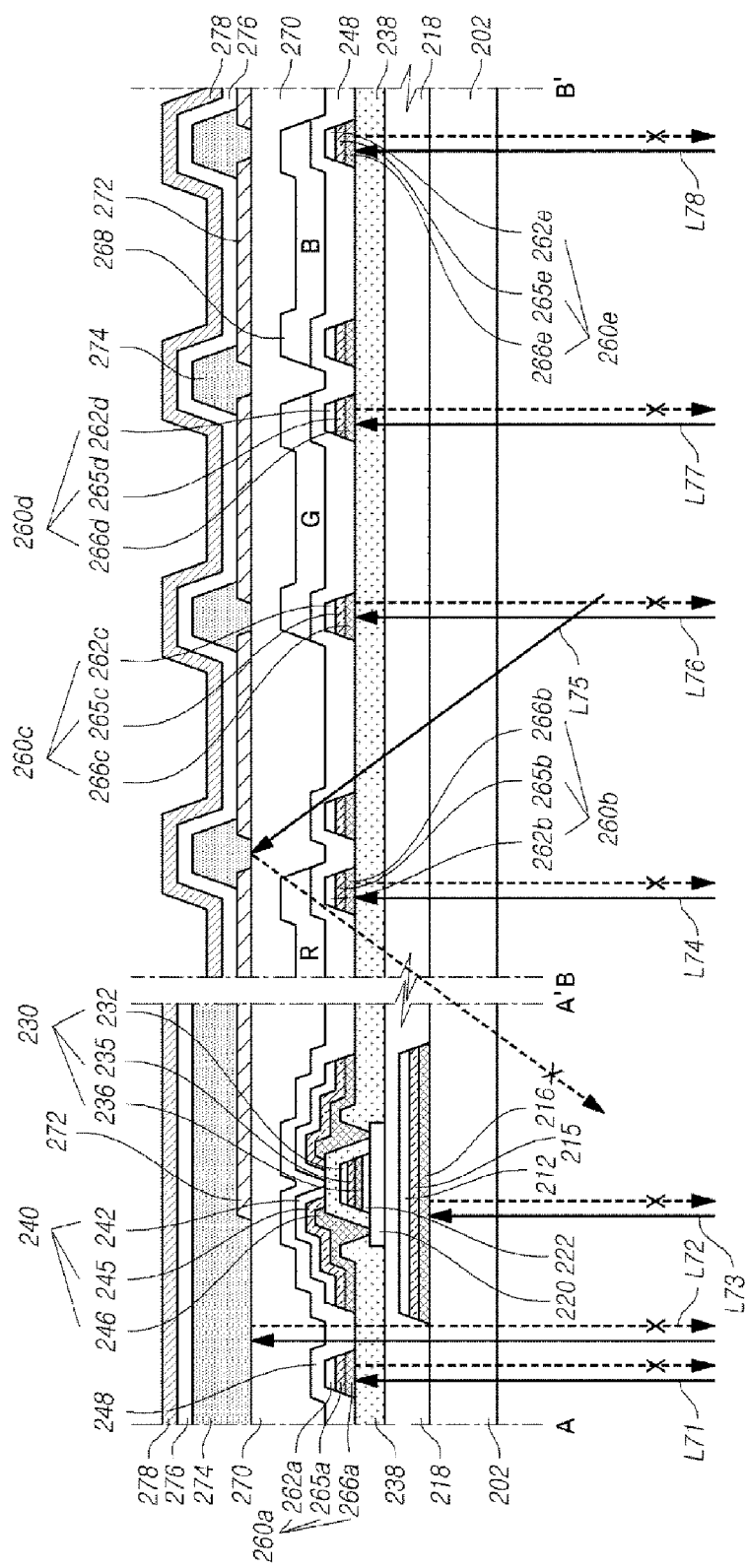
FIG. 6 is a schematic sectional view along the lines A-A' and B-B' of FIG. 2 according to another embodiment of the present invention.

FIG. 6 is a schematic sectional view along the lines A-A' and B-B' of FIG. 2 according to another embodiment of the present invention.

Referring to the organic light emitting display panel 200 of FIG. 6, a layer 210 for blocking light, a multitude of signal lines 260a, 260b, 260c, 260d and 260e, the first gate electrode 230, the first source electrode/the first drain electrode 240 may be comprised of conductive layers 212, 262a, 262b, 262c, 262d, 262e, 232 and 242, the first blocking layers 215, 265a, 265b, 265c, 265d, 265e, 235 and 245, and the second blocking layers 216,266a, 266b, 266c, 266d, 266e, 236 and 246.

In addition, the organic light emitting display panel 200 may include a bank 274 formed along the edge of the pixel electrode 272 and made of a black-based material, an organic layer 276 formed on the front surface of the bank 274 and the pixel electrode 272, and a common electrode 278 formed on the whole surface of the organic layer 276.

Further, the organic light emitting display panel 200 is illustrated to have, for example, a white OLED, and thus color filters 268, which may be red "R", green "G" and blue "B" filters, are formed on the fourth insulating layer 248.

In the typical organic light emitting display panel, the external light incident from the outside may be reflected by various signal lines or electrodes and may cause degradation of visibility, brightness and contrast ratio.

On the contrary, referring to the sectional view along the lines A-A' of the organic light emitting display panel 200 in FIG. 2, the first light L71 that is the external light may destructively interfere with each other or may be absorbed by the first blocking layer 265a and the second blocking layer 266a of the first line 260. The second light L72 may penetrate between the first line 260a and the first transistor T21 and may be absorbed by the bank 274. Further, the third light L73 may disappear due to destructive interference and absorption by the first blocking layer 215 and the second blocking layer 216 of the layer 210 for blocking light. Also, the first gate electrode 230 and the first source electrode/the first drain electrode 240 may play a role of blocking out the external light.

Referring to the sectional view along the lines B-B' of the organic light emitting display panel 200 in FIG. 2, the fourth light L74, the sixth light L76, the seventh light L77 and the eighth light L78 may be blocked out by the second line 260b, the third line 260c, the fourth line 260d and the fifth line 260e, respectively. In addition, the fifth light L75 slantingly incident on the substrate 202 may be absorbed by the bank 274 as well.

Although the organic light emitting display panel 200 is illustrated in a bottom emission type, it is not limited thereto, and it may be implemented by a top emission type.

In the case of the organic light emitting display panel 200 in a bottom emission type, non-polarized external lights L71 to L78 may be incident from the bottom of the substrate 202 (opposite side of the pixel electrode 272). In this case, degradation of visibility, brightness and contrast ratio due to the external lights L71 to L78 may be prevented by the bank 274 and the multiple light-blocking layers, which can absorb light. At this time, the bank 274 absorbs the external lights L71 to L78 in the area where the first blocking layers 215, 265a, 265b, 265c, 265d, 265e, 235 and 245, and the second blocking layers 216,266a, 266b, 266c, 266d, 266e, 236 and 246 are not located.

In addition, the bank 274 has the effect of reducing reflectivity by the common electrode 278. In the organic light emitting display panel 200 of the bottom-emission type, since the common electrode 278 is made of metal of high reflectivity, it may cause high reflectivity of the external lights L71 to L78. At this time, the reflectivity by the common electrode 278 may be minimized by the bank 274.

Meanwhile, the organic layer 276 and the common electrode 278 according to the embodiments of the present invention are coated on the whole surface, which may bring advantages of simplifying the procedure without the process of patterning to thereby reduce the manufacturing cost. Here, the organic layer 276 is illustrated to have a light-emitting layer that emits, for example, a white light.

In terms of another aspect, the display device 100 of the present invention may include patterns 250, 252, 254, 260a, 260b, 260c, 260d, 260e, 230, 252, 240, 256, 258, 210, 210' and 210" of a multi-layered structure on the substrate 202, which are comprised of the conductive layer and one or more light-blocking layers in whole or in part, and a bank 274 on the patterns 250, 252, 254, 260a, 260b, 260c, 260d, 260e, 230, 252, 240, 256, 258, 210, 210' and 210'', which is made of a light-absorbent material.

Here, the patterns 250, 252, 254, 260a, 260b, 260c, 260d, 260e, 230, 252, 240, 256, 258, 210, 210' and 210'' may include the signal lines 250, 252, 254, 260a, 260b, 260c, 260d and 260e, the electrodes 230, 252, 240, 256 and 258 of the transistors, and the layers 210, 210' and 210'' for blocking light formed to correspond to the transistors, which are formed on the substrate 202.

Hereinafter, experimental results with respect to the external light on the organic light emitting display panel 200 will be described with reference to graphs and tables.

The experiment has been conducted by using lights having a wavelength of 360 nm to 740 nm, and the incident angle of the light on the substrate 202 is 8° from the vertical axis. Also, the equipment of an integrating sphere type has been used. The diameter of the organic light emitting display panel 200 used in the experiment is 3 mm, and the experiment has been carried out in the environment of matt writing papers. Hereinafter, reflectivity refers to a ratio of the incident light to the reflected light.

FIGS. 7a to 7g illustrate graphs and a table to show reflectivity of the external light on the general organic light emitting display panel.

Figure 7A:
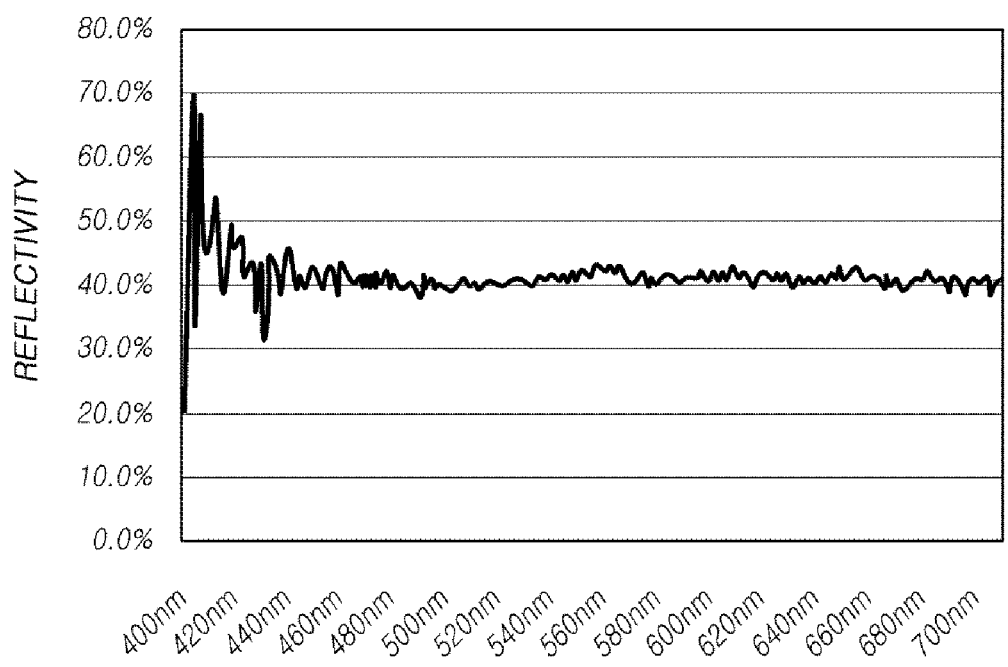
Figure 7B:
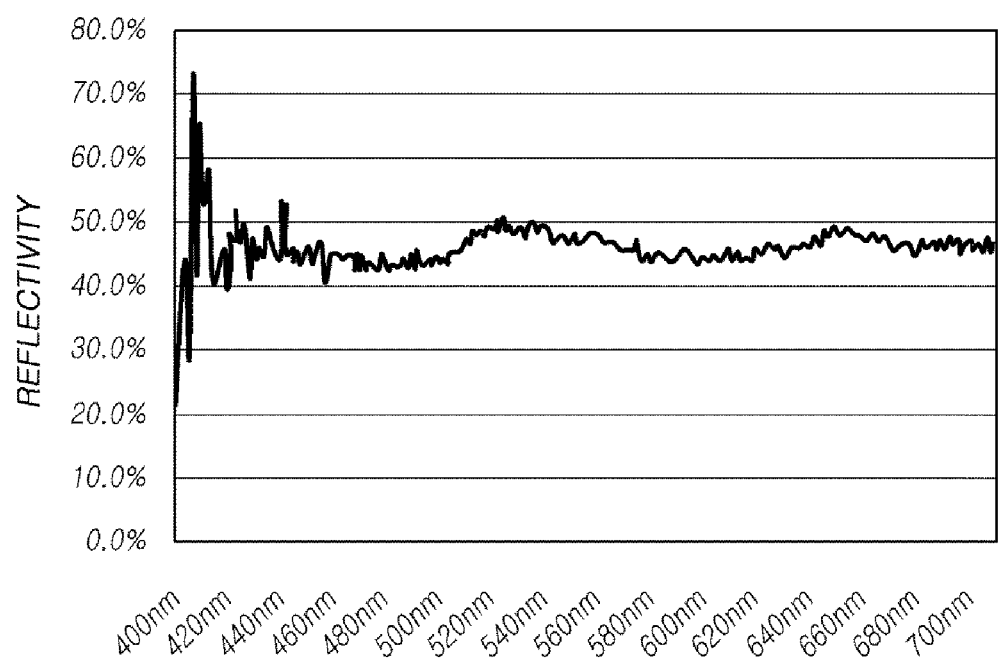
Figure 7C:
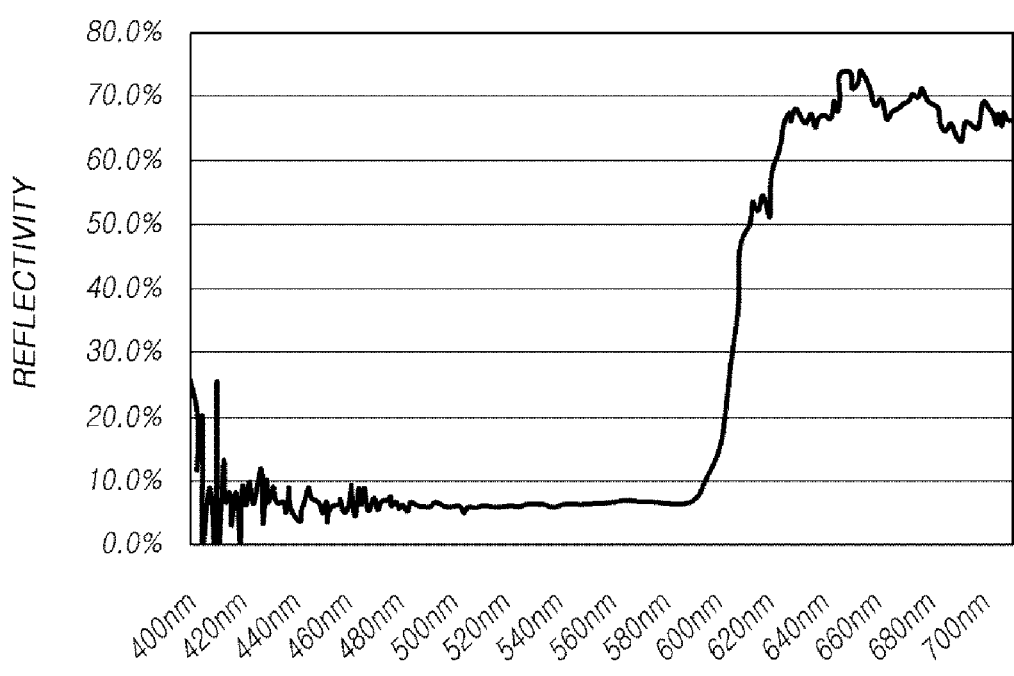
Figure 7D:
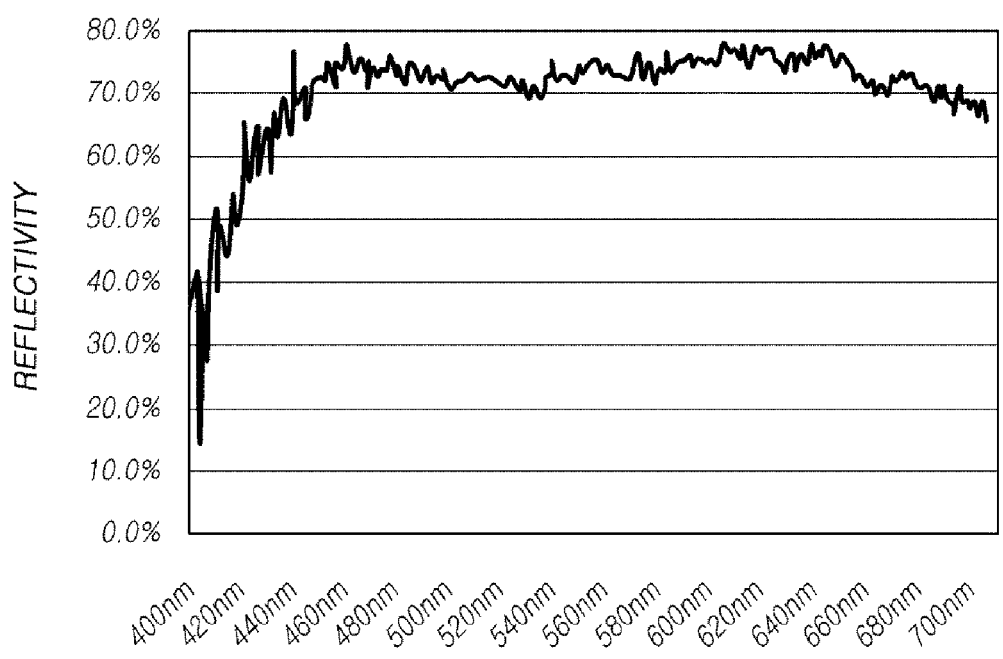
Figure 7E:
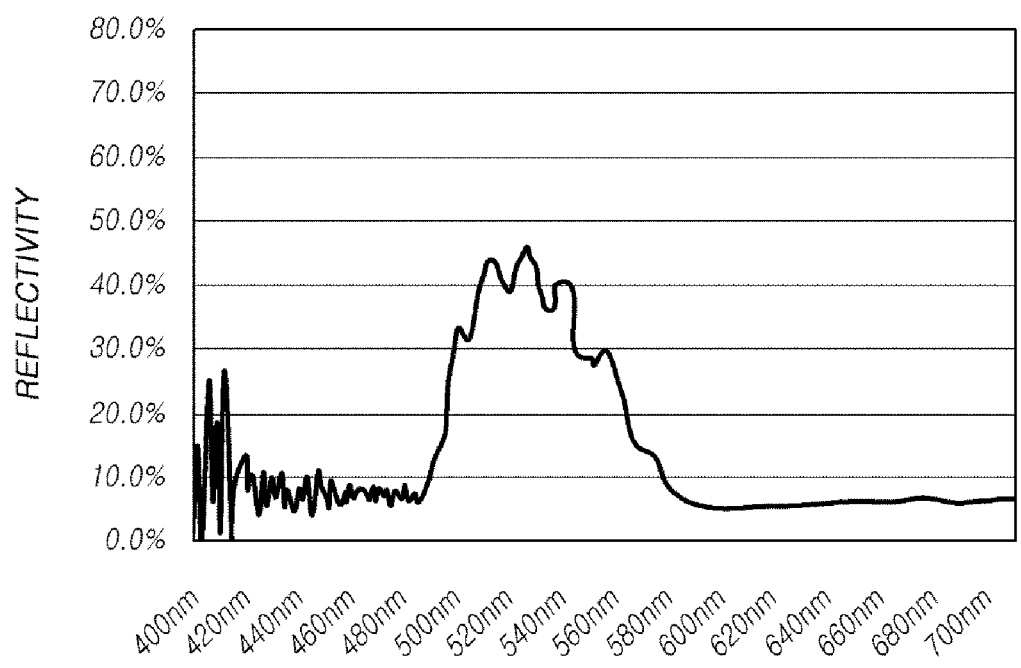
Figure 7F:
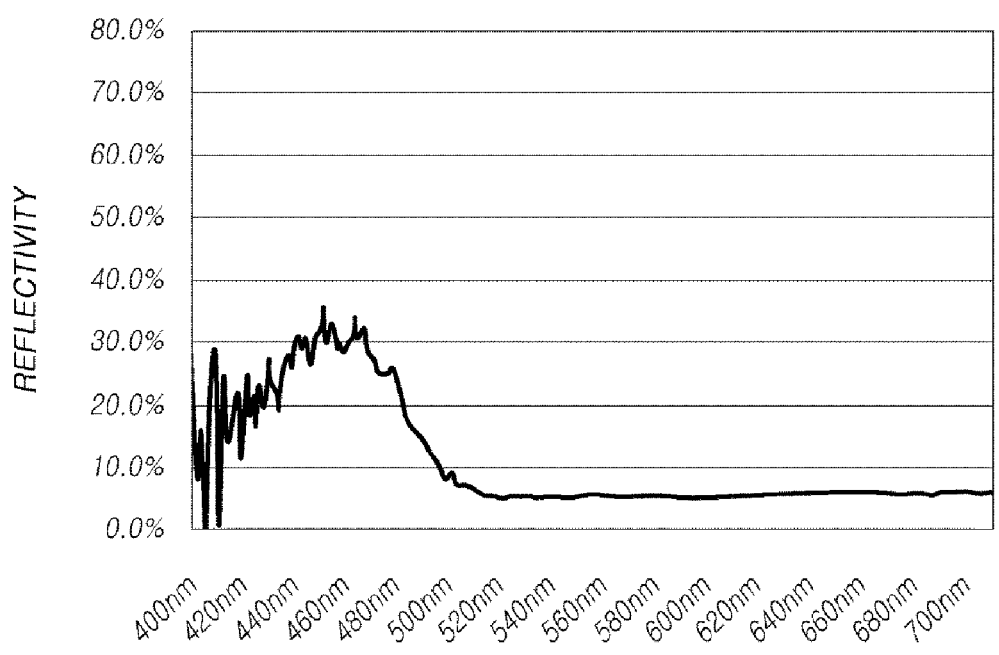

FIG. 7a shows the result of measuring the reflectivity of the light incident on the gate electrode and the source electrode/the drain electrode of the general organic light emitting display panel, and FIG. 7b shows the result of measuring the reflectivity of the light incident on the area where the layer for blocking light is formed. In addition, FIG. 7c shows the result of measuring the reflectivity of the light incident on the area where the red color filter is formed, and FIG. 7d shows the result of measuring the reflectivity of the light incident on the area where the color filter is not formed, that is, the area where the white light is emitted. Further, FIG. 7e shows the result of measuring the reflectivity of the light incident on the area where the green color filter is formed, and FIG. 7f shows the result of measuring the reflectivity of the light incident on the area where the blue color filter is formed.

The average values of the reflectivity in FIGS. 7a, 7b, 7c, 7d, 7e and 7f are 41.1%, 46.5%, 13.5%, 74.3%, 24.8% and 6.6%, respectively.

The above results are shown in table of FIG. 7g. In FIG. 7g, R', G' and B' refer to the case in which the light is incident on the area where the color filters overlap the bank, and R, G and B refer to the case in which the light is incident on the area where the color filters do not overlap the bank, that is, the opening area. In addition, the area ratio means the ratio of the area occupied by each element to the unit pixel, and the areal reflectivity indicates the value obtained by multiplying the measured reflectivity by the area ratio. The total value of the reflectivity may be calculated by summating the areal reflectivity of each area.

The general organic light emitting display panel shows that about 39.05% of the external light was reflected in total. The reflected external light may cause degradation of the contrast ratio as well as reduction of both the brightness and visibility of the organic light emitting display panel.

FIGS. 8a to 8g illustrate graphs and a table to show reflectivity of the external light on an organic light emitting display panel according to another embodiment of the present invention.

FIGS. 8a to 8g show the results of measuring reflectivity in the case in which the layers 210, 210' and 210'' for blocking light, a plurality of signal lines 250, 252, 254, 260a, 260b, 260c, 260d and 260e, the gate electrodes 230 and 252, the source electrode and the drain electrodes 240, 256 and 258 are formed with the conductive layer and the double-layered light-blocking layer (the first blocking layer and the second blocking layer), and the bank 274 is made of a light-absorbent material.

Figure 8A:
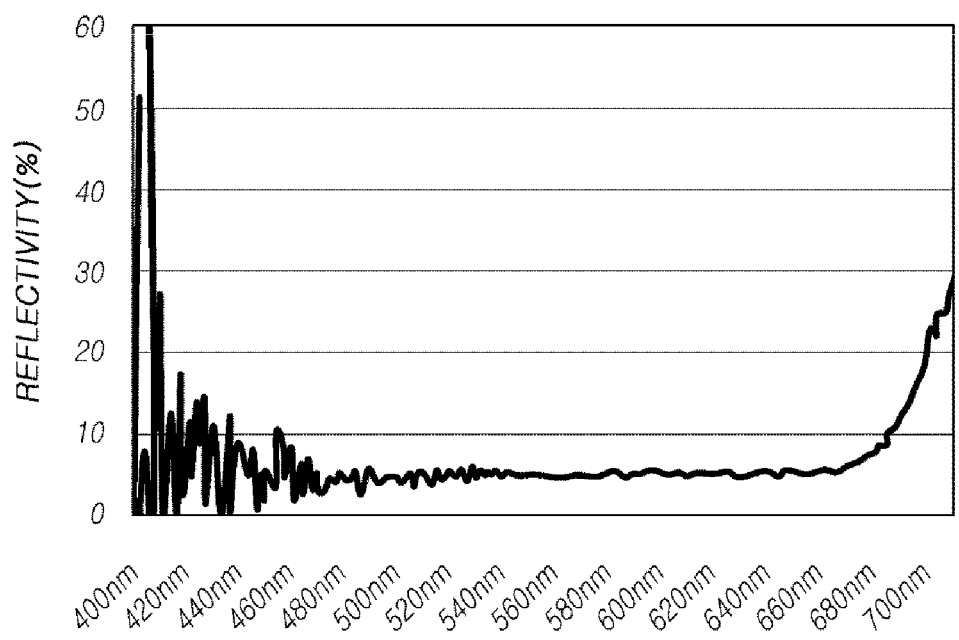
Figure 8B:
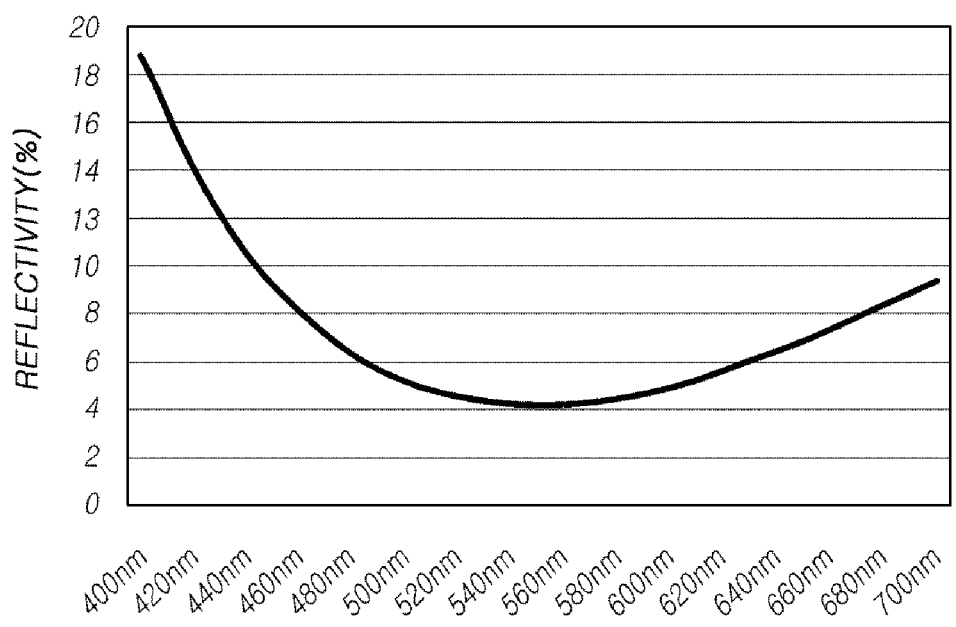
Figure 8C:
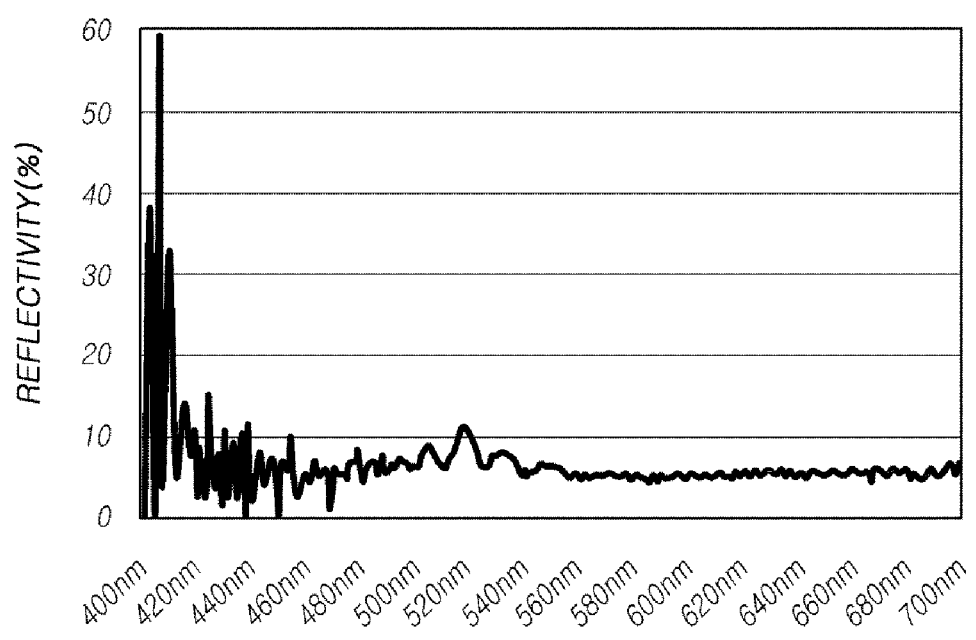
Figure 8D:
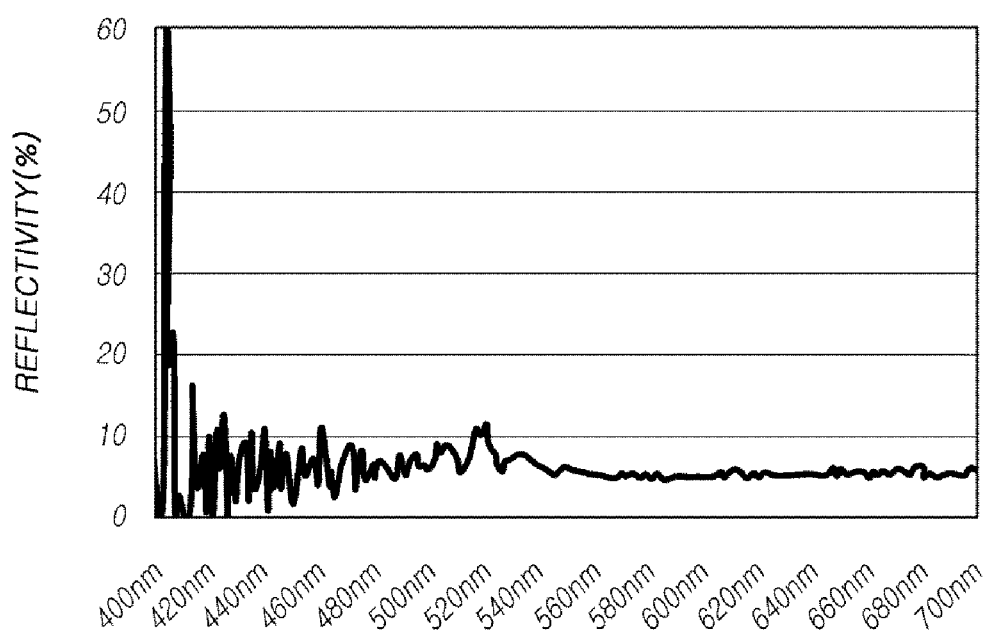
Figure 8E:
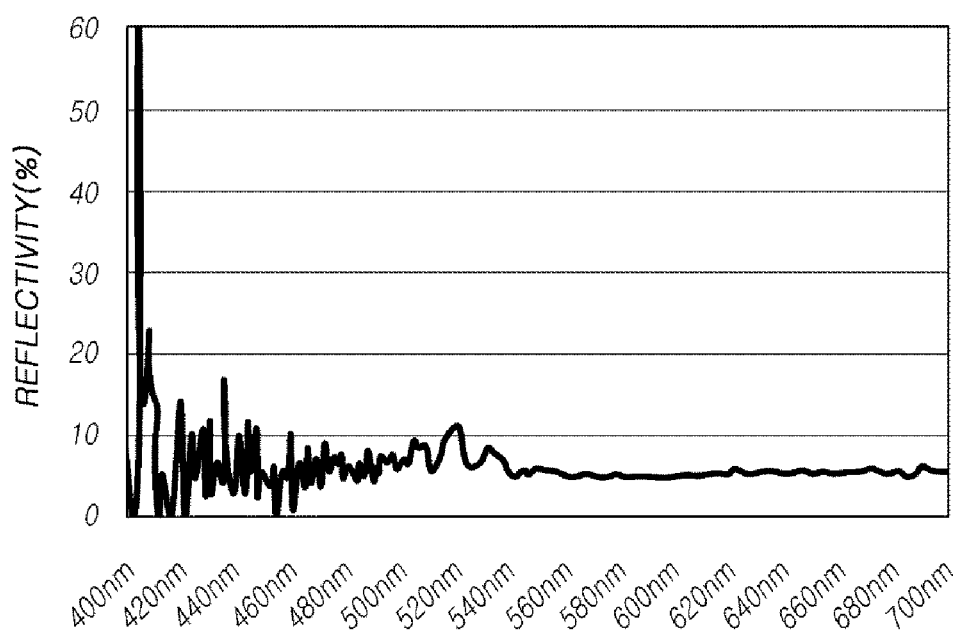
Figure 8F:
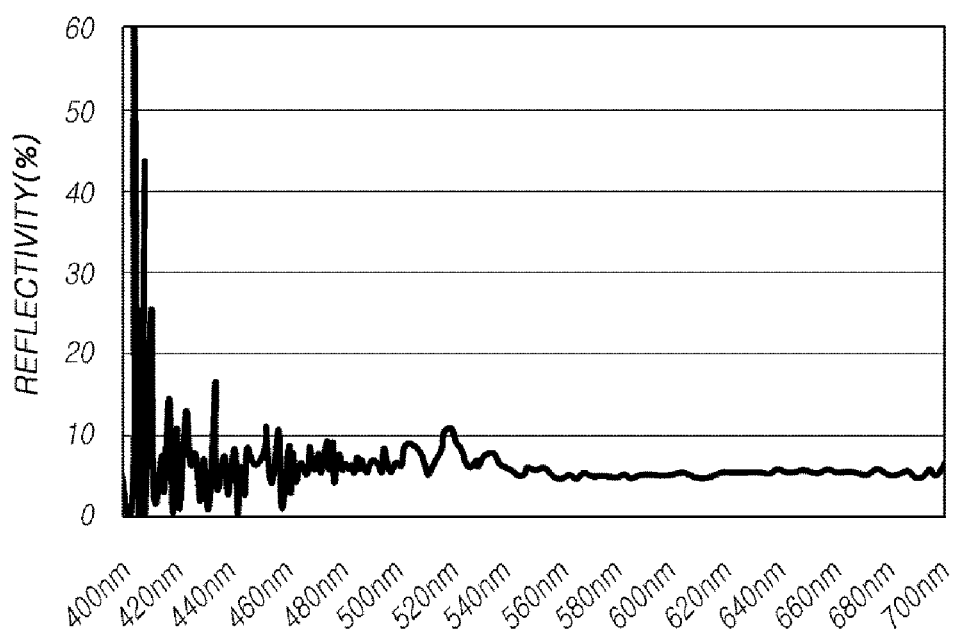

Specifically, FIG. 8a shows the result of measuring the reflectivity of the light incident on the bank 274 of the organic light emitting display panel 200, and FIG. 8b shows the result of measuring the reflectivity of the light incident on the layers 210, 210' and 210'' for blocking light, a plurality of signal lines 250, 252, 254, 260a, 260b, 260c, 260d and 260e, the gate electrodes 230 and 252, the source electrode and the drain electrodes 240, 256 and 258. Further, FIG. 8c shows the result of measuring the reflectivity of the light incident on the area where the red "R" color filter 268 overlaps the bank 274 in the organic light emitting display panel 200, and FIG. 8d shows the result of measuring the reflectivity of the light incident on the area where the bank 274 is not formed, that is, the bank 274 that overlaps the area where the white light is emitted. Further, FIG. 8e shows the result of measuring the reflectivity of the light incident on the area where the green "G" color filter 268 overlaps the bank 274 in the organic light emitting display panel 200, and FIG. 8f shows the result of measuring the reflectivity of the light incident on the area where the blue "B" color filter overlaps the bank 274.

The average values of the reflectivity in FIGS. 8a, 8b, 8c, 8d, 8e and 8f are 5.08%, 7.44%, 6.12%, 6.07%, 5.97% and 6.02%, respectively.

The above results are shown in a table of FIG. 8g.

Comparing FIG. 7g with FIG. 8g, the reflectivity in the area where the layer 210 for blocking light is formed decreased from 46.5% to 7.5%, and the reflectivity in the area where the gate electrodes 230 and 252, and the source electrode and the drain electrodes 240, 256 and 258 are formed decreased from 41.1% to 7.5%. In addition, it shows that the reflectivity in each area where the red "R", green "G" and blue "B" color filters overlap the bank 274, respectively, was reduced from 13.5%, 24.8% and 6.6% to 6.0%, respectively. Further, it can be seen that the reflectivity in the area where the common electrode 278 overlaps the bank 274 decreased from 74.3% to 5.0%. The overall reflectivity deceased from 39.5% to 15.16% in total.

As described above, the organic light emitting display panel 200 according to the present invention has the effect of remarkably reducing the reflectivity of the external light. Accordingly, visibility and contrast ratio properties of the organic light emitting display panel 200 can be enhanced with the increase in brightness.

In addition, according to the organic light emitting display panel 200 of the present invention, the manufacturing cost may be reduced and the manufacturing process may be simplified by eliminating the high-cost polarizing plate or polarizing layer structure and coating the whole surface with the organic layer 276.

Although various embodiments have been described up to now with reference to the accompanying drawings, the present invention is not limited to them.

Further, the terms "includes", "constitutes", or "has" mentioned above mean that a corresponding structural element is included unless they have no reverse meaning. Accordingly, it should be interpreted that the terms may not exclude but further include other structural elements. All the terms that are technical, scientific or otherwise agree with the meanings as understood by a person skilled in the art unless defined to the contrary. Common terms as found in dictionaries should be interpreted in the context of the related technical writings not too ideally or impractically unless the present disclosure expressly defines them so.

Although the embodiments of the present invention have been described for illustrative purposes, those skilled in the art will appreciate that various modifications, additions and substitutions are possible, without departing from the scope and spirit of the invention. Accordingly, the embodiments disclosed in the present invention are merely to not limit but describe the technical spirit of the present invention. Further, the scope of the technical spirit of the present invention is not limited by the embodiments. The scope of the present invention shall be construed on the basis of the accompanying claims in such a manner that all of the technical ideas included within the scope equivalent to the claims belong to the present invention.

DESCRIPTION OF REFERENCE NUMERALS

202: substrate
210: light-blocking layer
230: gate electrode
272: pixel electrode
274: bank
278: common electrode

What is claimed is:

1. An organic light emitting display panel comprising:
a plurality of signal lines formed on a first and a second insulating layer, where the first insulating layer is formed on a substrate, and where at least one of the signal lines comprises a conductive layer and a light-blocking layer which comprises a first light-blocking layer containing metal oxides and a second light-blocking layer containing a light-absorbent metal;
a transistor formed on the first insulating layer and comprising a gate electrode, a source electrode, a drain electrode and a semiconductor layer;
a layer for blocking light formed in areas directly under the semiconductor layer of the transistor between the substrate and transistor where the layer for blocking light comprises the conductive layer, the first light-blocking layer and the second light-blocking layer, and where all of the plurality of signal lines are formed above the layer for blocking light;
a pixel electrode connected to the source electrode or to the drain electrode; and
a bank formed along the edge of the pixel electrode such that the pixel electrode is partially exposed, the bank comprising a light-absorbent material or coated with a light-absorbent substance,
wherein all of the plurality of signal lines are located on the substrate with the sequence of the second light-blocking layer, the first light-blocking layer and the conductive layer.

2. The organic light emitting display panel according to claim 1, wherein the conductive layer comprises at least one of Al, Pt, Pd, Ag, Mg, Au, Ni, Nd, Ir, Cr, Li, Ca, Mo, Ti, W and Cu, or an alloy thereof.

3. The organic light emitting display panel according to claim 1, wherein the light-absorbent metal is capable of absorbing external light incident through the substrate.

4. The organic light emitting display panel according to claim 3, wherein the conductive layer comprises at least one of Al, Pt, Pd, Ag, Mg, Au, Ni, Nd, Ir, Cr, Li, Ca, Mo, Ti, W and Cu, or an alloy thereof.

5. The organic light emitting display panel according to claim 1, wherein the metal oxide is selected from the group consisting of IGZO, IGO, IZO, ZTO, IHZO and IZZO.

6. The organic light emitting display panel according to claim 3, wherein the external light incident through the substrate is non-polarized light.

7. The organic light emitting display panel according to claim 1, wherein the substrate is selected from the group consisting of PET, PEN, polyamide and glass.

8. The organic light emitting display panel according to claim 1, wherein the bank comprises carbon black, black pigments that are mixtures of carbon black and two or more color pigments, black dyes of a single ingredient or mixtures of two or more different color dyes, black resin, graphite powder, gravure ink, black spray or black enamel.

\* \* \* \* \*